United States Patent
Furuhata

(10) Patent No.: US 7,026,685 B2
(45) Date of Patent: Apr. 11, 2006

(54) SEMICONDUCTOR DEVICES HAVING A NON-VOLATILE MEMORY TRANSISTOR AND METHODS FOR MANUFACTURING THE SAME

(75) Inventor: Tomoyuki Furuhata, Sakafu (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/873,596

(22) Filed: Jun. 21, 2004

(65) Prior Publication Data

US 2005/0023598 A1 Feb. 3, 2005

Related U.S. Application Data

(62) Division of application No. 10/014,584, filed on Dec. 14, 2001, now Pat. No. 6,812,519.

(30) Foreign Application Priority Data

Dec. 15, 2000 (JP) .............................. 2000-382396

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 29/788* (2006.01)
*H01L 29/792* (2006.01)

(52) U.S. Cl. ...................... 257/316; 257/288; 257/314; 257/315; 257/321; 257/324; 257/326

(58) Field of Classification Search ................ 257/288, 257/314, 315, 316, 318, 319, 320, 321, 322, 257/324, 326
See application file for complete search history.

(56) References Cited

U.S. PATENT DOCUMENTS

| | | | | |
|---|---|---|---|---|
| 5,895,949 A | * | 4/1999 | Endoh | 257/314 |
| 5,959,879 A | * | 9/1999 | Koo | 365/145 |
| 6,100,579 A | * | 8/2000 | Sonoda et al. | 257/632 |
| 6,274,907 B1 | * | 8/2001 | Nakagawa | 257/354 |
| 6,723,604 B1 | * | 4/2004 | Yuan et al. | 438/257 |

* cited by examiner

*Primary Examiner*—Nathan J. Flynn
*Assistant Examiner*—Victor A Mandala, Jr.
(74) *Attorney, Agent, or Firm*—Konrad Raynes & Victor, LLP; Alan S. Raynes

(57) ABSTRACT

Semiconductor devices including a non-volatile memory transistor and methods for manufacturing such semiconductor devices are described. One semiconductor device may include a silicon substrate 10, a floating gate 22 disposed above the silicon substrate 10 through a first dielectric layer 20, a second dielectric layer 26 that contacts at least a part of the floating gate 22, a control gate 28 formed over the second dielectric layer 26, and a source region 14 and a drain region 16 formed in the silicon substrate 10. A wiring layer 40 is provided above the floating gate 22, and the entirety of the floating gate 22 is overlapped by the wiring layer 40 as viewed in a plan view.

3 Claims, 16 Drawing Sheets

E - E cross section (a)

A - A cross section (b)

B - B cross section

C - C cross section (a)

(b)

(a)

(b)

(a)

(b)

(a)

(b)

(a)

(b)

(a)

(b)

(a)

D - D cross section (b)

E - E cross section

SEMICONDUCTOR DEVICES HAVING A NON-VOLATILE MEMORY TRANSISTOR AND METHODS FOR MANUFACTURING THE SAME

This application is a divisional of U.S. application Ser. No. 10/014,584, filed Dec. 14, 2001, which is hereby incorporated by reference in its entirety. Applicant hereby incorporates by reference Japanese Application No. 2000-382396, filed Dec. 15, 2000, in its entirety.

TECHNICAL FIELD

The present invention relates to semiconductor devices including a non-volatile memory transistor and methods for manufacturing the same.

RELATED ART

A transistor having a split-gate structure is known as one of the devices that are applied to an electrically erasable programmable ROM (EEPROM). FIG. 16 schematically shows a cross-sectional view of one example of a conventional semiconductor device including a non-volatile memory transistor.

The semiconductor device includes a non-volatile memory transistor having a split-gate structure (hereafter referred to as a "memory transistor") 300.

The memory transistor 300 has, in the case of an N-type transistor as an example, a source region 14 and a drain region 16 composed of $n^+$-type impurity diffusion layers formed in the silicon substrate 10 of P-type, and a first dielectric layer 70 as a gate insulation layer formed on a surface of the silicon substrate 10. A floating gate 72, a second dielectric layer 76 and a control gate 78 are successively formed on the first dielectric layer 70.

A third dielectric layer 74 is formed on the floating gate 72. The third dielectric layer 74 is composed of a dielectric layer that is formed by selectively oxidizing a part of a polysilicon layer that becomes the floating gate 72. The third dielectric layer 72 has a structure in which the film thickness thereof becomes thinner from its center toward its end sections, as shown in FIG. 16. As a result, upper edge sections 720 of the floating gate 72 form sharp edges, such that an electric field concentration is apt to occur at the upper edge sections 720.

For the operation of the memory transistor with a split-gate structure 300, a channel current is flown between the source region 14 and the drain region 16 to thereby inject a charge (hot electrons) in the floating gate 72 as indicated by an arrow A10 when data is written. When data is erased, a predetermined high voltage is applied to the control gate 78 to thereby transfer the charge stored in the floating gate 72 through the second dielectric layer 76 to the control gate 78 as indicated by an arrow B10 by Fowler-Nordheim tunneling conduction (FN conduction).

SUMMARY

Certain embodiments relate to a semiconductor device having a non-volatile memory transistor. The device includes a semiconductor layer and a floating gate disposed over the semiconductor layer through a first dielectric layer that acts as a gate dielectric layer. The device also includes a second dielectric layer that contacts at least a part of the floating gate and is capable of functioning as a tunneling dielectric layer, and a control gate formed over the second dielectric layer. The device also includes an impurity diffusion layer that forms a source region or a drain region formed in the semiconductor layer. A conduction layer is provided above the floating gate, and the conduction layer entirely overlaps the floating gate.

Embodiments also include a semiconductor having a non-volatile memory transistor device, including a semiconductor layer and a floating gate disposed over the semiconductor layer through a first dielectric layer as a gate dielectric layer. The device also includes a second dielectric layer that contacts at least a part of the floating gate and is capable of functioning as a tunneling dielectric layer, and a control gate formed over the second dielectric layer. The device also includes an impurity diffusion layer that forms a source region or a drain region formed in the semiconductor layer. A plurality of conduction layers are formed at different levels above the floating gate, and the floating gate is entirely overlapped by the plurality of conduction layers as viewed in a plan view.

Embodiments also include to a semiconductor device having a non-volatile memory transistor, including a non-volatile memory transistor including a semiconductor layer, a floating gate disposed above the semiconductor layer, and a control gate formed above the floating gate, wherein a conduction layer is provided vertically above the floating gate at least in a region where the control gate is not disposed vertically above the floating gate.

Embodiments also include to a semiconductor device having a non-volatile memory transistor, comprising a non-volatile memory transistor including a semiconductor layer, a floating gate disposed above the semiconductor layer, and a control gate formed above the floating gate, wherein a conduction layer is provided above the non-volatile memory transistor and a portion of the conduction layer is located vertically above the floating gate. In addition, a width of the conduction layer located vertically above the floating gate is formed to be greater than a width of the floating gate.

Embodiments also include a semiconductor device having a non-volatile memory transistor, including a non-volatile memory transistor including a semiconductor layer, a floating gate disposed above the semiconductor layer, and a control gate disposed above the floating gate, wherein a plurality of conduction layers having a multiple layered structure are provided above the non-volatile memory transistor. In addition, at least one conduction layer among the plurality of conduction layers is provided vertically above the floating gate at least in a region where the control gate is not disposed vertically above the floating gate.

Embodiments also include a semiconductor device having a non-volatile memory transistor, comprising a semiconductor layer and a floating gate disposed over the semiconductor layer through a first dielectric layer that comprises a gate dielectric layer. The device also includes a second dielectric layer that contacts at least a part of the floating gate and comprises a tunneling dielectric layer. In addition, the device includes a control gate formed over the second dielectric layer, and one or more conduction layers formed over the floating gate. The floating gate includes an upper surface, and a line normal to any portion of the upper surface will contact at least one of the one or more conduction layers over the floating gate.

Embodiments also include a method for manufacturing a semiconductor device having a non-volatile memory transistor, including forming a first dielectric layer comprising a gate dielectric layer on a substrate and forming a floating gate over the gate dielectric layer. The method also includes forming a second dielectric layer that contacts at least a part of the floating gate and is capable of functioning as a tunneling dielectric layer. The method also includes forming a control gate over the second dielectric layer and forming an impurity diffusion layer that forms a source region or a drain region in the semiconductor layer. In addition, the method also includes forming a conduction layer above the floating gate so that a portion of the conduction layer is positioned vertically above the floating gate, where the portion of the conduction layer overlaps the entire floating gate.

Embodiments also include a method for manufacturing a semiconductor device having a non-volatile memory transistor, including forming a floating gate above a semiconductor layer, forming a control gate above the floating gate, and forming a conduction layer vertically above the floating gate at least in a region where the control gate is not disposed vertically above the floating gate.

Embodiments also include a method for manufacturing a semiconductor device having a non-volatile memory transistor, including forming a floating gate above a semiconductor layer, forming a control gate above the floating gate, and forming a plurality of conduction layers having a multiple layered structure above the non-volatile memory transistor, wherein at least one of the conduction layers is formed vertically above the floating gate at least in a region where the control gate is not disposed vertically above the floating gate.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
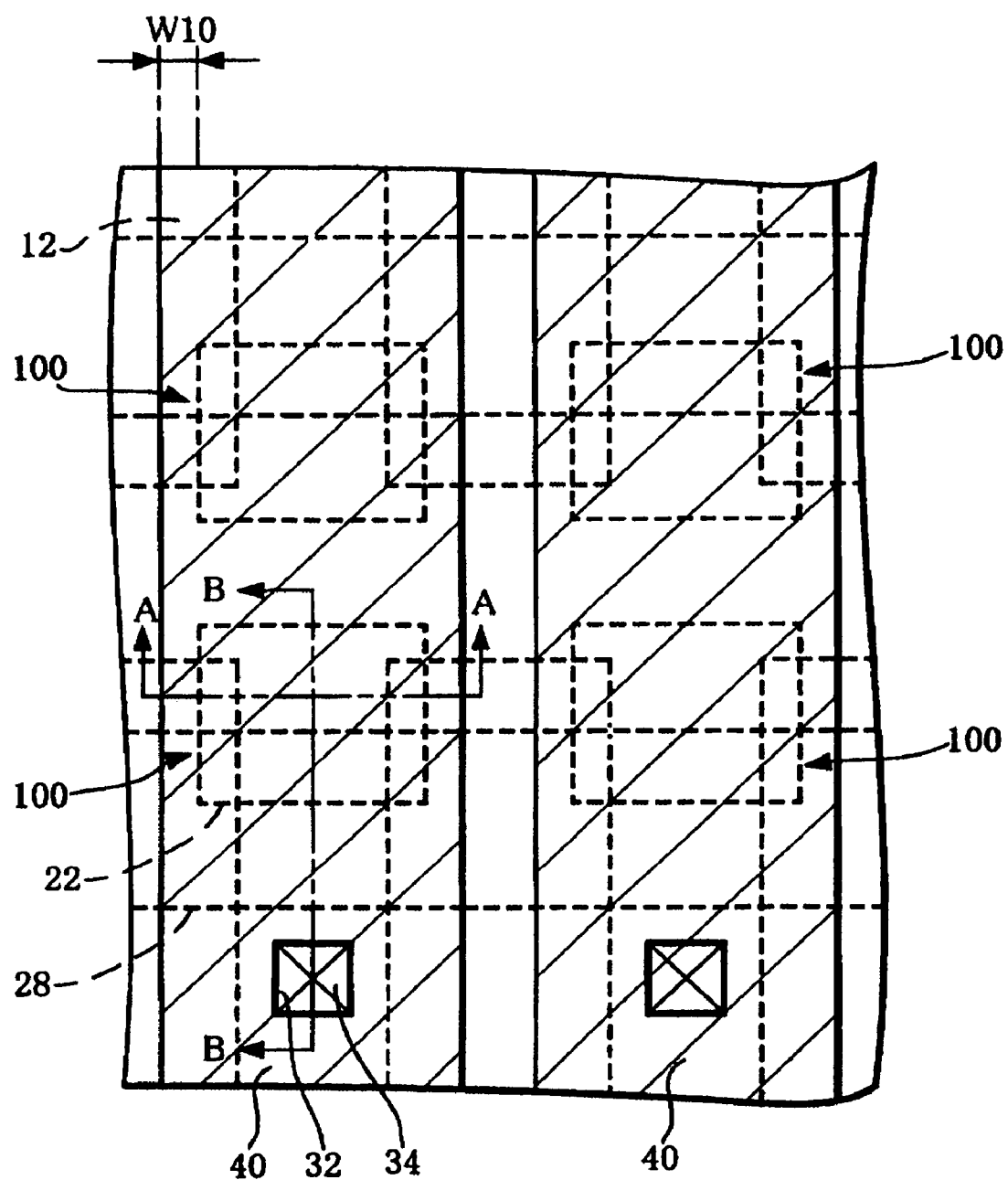
FIG. 1 schematically shows a cross-sectional view of a semiconductor device in accordance with an embodiment of the present invention.

Certain embodiments of the present invention relate to semiconductor devices having a non-volatile memory transistor with an improved rewritable number characteristic.

A first semiconductor device having a non-volatile memory transistor in accordance with an embodiment of the present invention comprises: a semiconductor layer; a floating gate disposed over the semiconductor layer through a first dielectric layer as a gate dielectric layer; a second dielectric layer that contacts at least a part of the floating gate and is capable of functioning as a tunneling dielectric layer; a control gate formed over the second dielectric layer; and an impurity diffusion layer that forms a source region or a drain region formed in the semiconductor layer, wherein a conduction layer is provided above the floating gate, and the floating gate is entirely overlapped by the conduction layer as viewed in a plan view.

It the present embodiment, the entirety of the floating gate is overlapped by the conduction layer as viewed in a plan view. Accordingly, the conduction layer can protect the floating gate from charges (process-induced charges) that are generated in a variety of steps (for example, an etching step) for forming layers above the conduction layer. As a result, the charges are prevented from being trapped in the second dielectric layer in a region where it contacts the floating gate. Therefore, deterioration of the second dielectric layer can be suppressed, and the rewritable number can be improved.

Also, when the conduction layer outwardly protrudes from an end of the floating gate as viewed in a plan view, a width of a portion of the conduction layer that outwardly protrudes from the end of the floating gate as viewed in a plan view may preferably be 0.5 μm or smaller.

Also, a side end of the conduction layer formed above the floating gate and an end of the floating gate may concur at least partially with one another as viewed in a plan view.

Also, a width of the conduction layer above a region other than a region where the floating gate is formed may be made narrower than a width of the conduction layer above the region where the floating gate is formed.

Also, the conduction layer may be electrically connected to the semiconductor layer.

Also, a first semiconductor device having a non-volatile memory transistor may comprise a non-volatile memory transistor including a semiconductor layer, a floating gate disposed above the semiconductor layer; and a control gate formed above the floating gate, wherein a conduction layer is provided vertically above the floating gate at least in a region where the control gate is not disposed above. By "vertically above" it is meant that a vertical line extending from the floating gate will contact the structure designated. For example, as used in this paragraph, "vertically above" means that a vertical line extending from the floating gate will contact a conduction layer at least in a region where the control gate is not disposed above the floating gate.

The control gate also preferably has an effect to protect the floating gate from process-induced charges. Accordingly, in accordance with the present embodiment, since a control gate or a conduction layer is always disposed vertically above the entire surface of the floating gate, the entire upper surface of the floating gate can be protected from process-induced charges. As a result, the rewritable number can be improved.

A width of the conduction layer located vertically above the floating gate may in certain embodiments be formed to be greater than a width of the floating gate.

Also, a width of the conduction layer located other than vertically above the floating gate may be formed to be smaller than a width of the conduction layer located vertically above the floating gate. By reducing the width of the conduction layer located other than vertically above the floating gate, stresses to be caused by the conduction layer can be reduced to a minimum, compared to the structure in which the width of a conduction layer is uniformly wider than the width of a floating gate.

Also, the conduction layer may be a wiring layer.

Also, when the wiring layer has a multiple layered structure, the wiring layer may be a lowermost wiring layer.

A second semiconductor device having a non-volatile memory transistor device in accordance with the present invention comprises: a semiconductor layer; a floating gate disposed over the semiconductor layer through a first dielectric layer as a gate dielectric layer; a second dielectric layer that contacts at least a part of the floating gate and is capable of functioning as a tunneling dielectric layer; a control gate formed over the second dielectric layer; and an impurity diffusion layer that forms a source region or a drain region formed in the semiconductor layer, wherein a plurality of conduction layers are formed at different levels above the floating gate, and the entirely of the floating gate is covered by the plurality of conduction layers at different levels.

It is noted that the term "different levels" means that they are formed on different interlayer dielectric layers.

In certain embodiments of the present invention, the entirety of the floating gate is covered by the plurality of conduction layers at different levels. Accordingly, the floating gate can be protected from charges (process-induced charges) that are generated in a variety of steps (for example, an etching step) for forming layers above the uppermost conduction layer among the conduction layers that overlap the floating gate as viewed in a plan view. As a result, the charges are prevented from being trapped in the second dielectric layer in a region where it contacts the floating gate. Therefore, deterioration of the second dielectric layer can be suppressed, and the rewritable number can be improved.

Also, when at least one of the conduction layers outwardly protrudes from an end of the floating gate as viewed in a plan view, a width of a portion of the conduction layer that outwardly protrudes from the end of the floating gate as viewed in a plan view may preferably be 0.5 µm or smaller.

Also, a side end of the at least one of the conduction layers and an end of the floating gate may concur at least partially with one another as viewed in a plan view.

Also, the conduction layer may be electrically connected to the semiconductor layer.

Also, a second semiconductor device having a non-volatile memory transistor may comprise a non-volatile memory transistor including a semiconductor layer, a floating gate disposed above the semiconductor layer, and a control gate disposed above the floating gate, wherein a plurality of conduction layers having a multiple layered structure are provided above the non-volatile memory transistor, and at least one conduction layer among the plurality of conduction layers is provided vertically above the floating gate at least in a region where the control gate is not disposed above.

In accordance with certain embodiments of the present invention, since a control gate or a conduction layer is always disposed vertically above the entire surface of the floating gate, the entire upper surface of the floating gate can be protected from process-induced charges. As a result, the rewritable number can be improved.

Certain embodiments may also be described as having a control gate and/or one or more conduction layers covering or overlapping the upper surface of the floating gate when viewed from above.

In the first and second semiconductor devices described above, the device may further include another circuit region mix-mounted therein. The other circuit region may include at least a logic circuit.

The "semiconductor layer" described above may include a semiconductor substrate and a semiconductor layer formed on a substrate.

Certain preferred embodiments of the present invention are described below with reference to the accompanying drawings.

Figure 2:
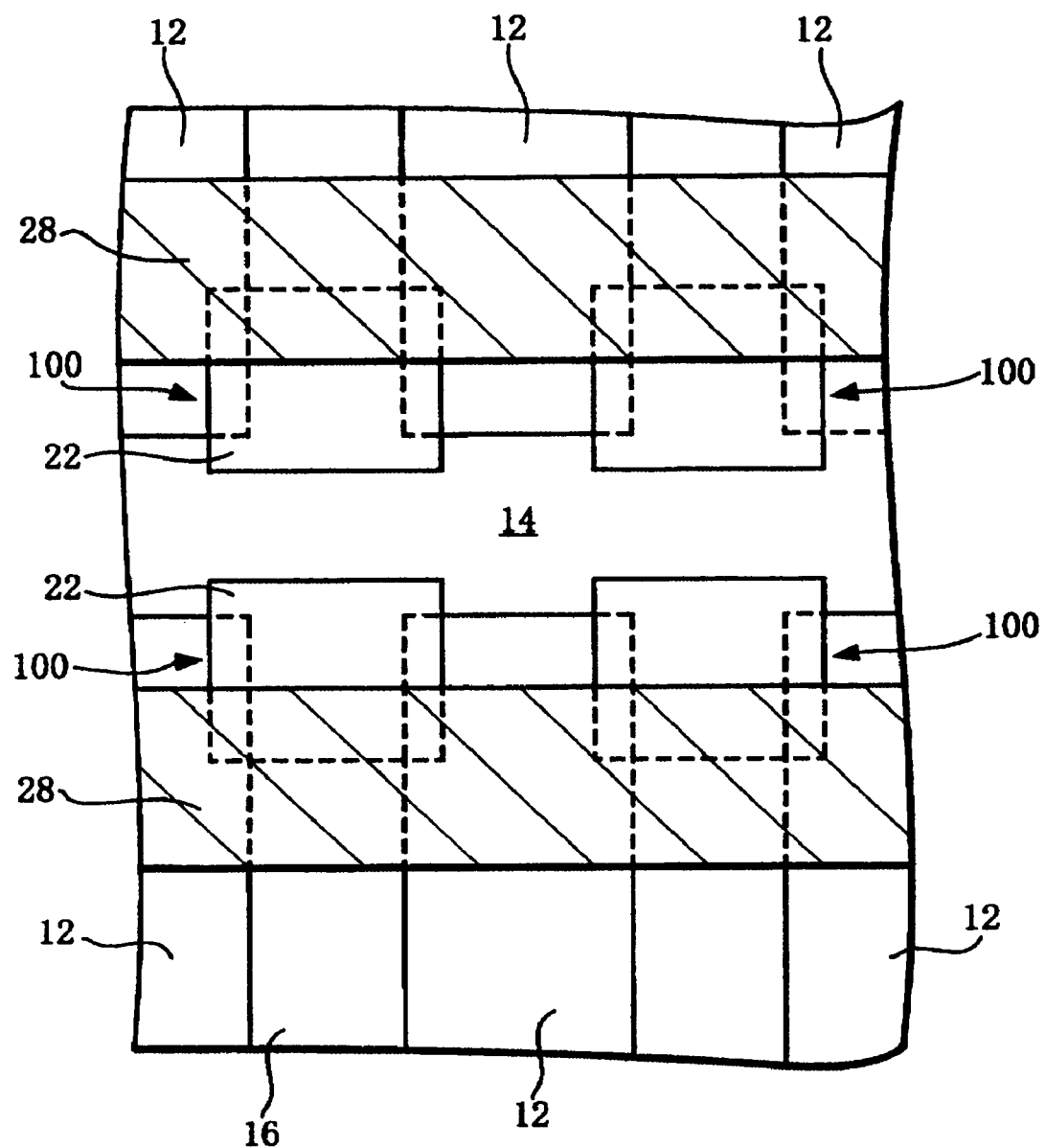
FIG. 2 schematically shows a plan view of a plan surface of a semiconductor device bulk (including isolation region, diffusion layer, floating gate and control gate) in accordance with an embodiment of the present invention.
Figure 3:
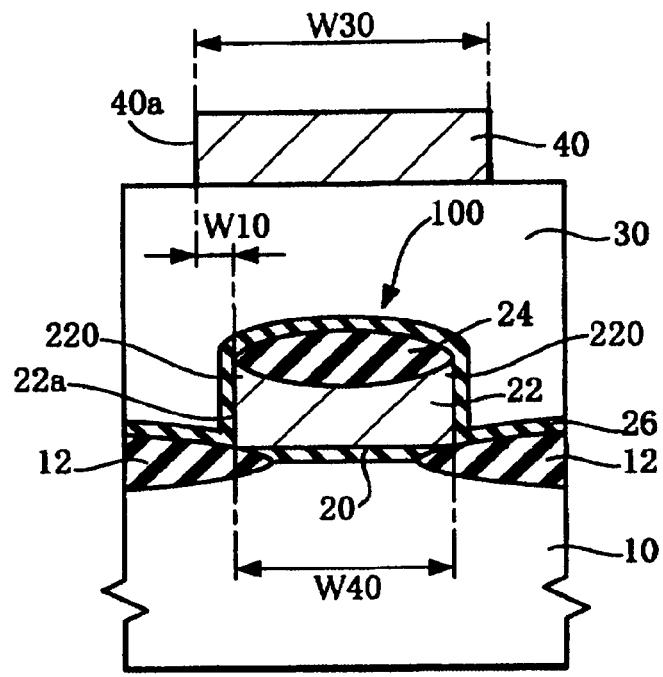
FIG. 3($a$) schematically shows a cross-sectional view of a cross section taken along a line A—A of FIG. 1, and ($b$) schematically shows a cross-sectional view of a cross section taken along a line B—B of FIG. 1.
Figure 3:
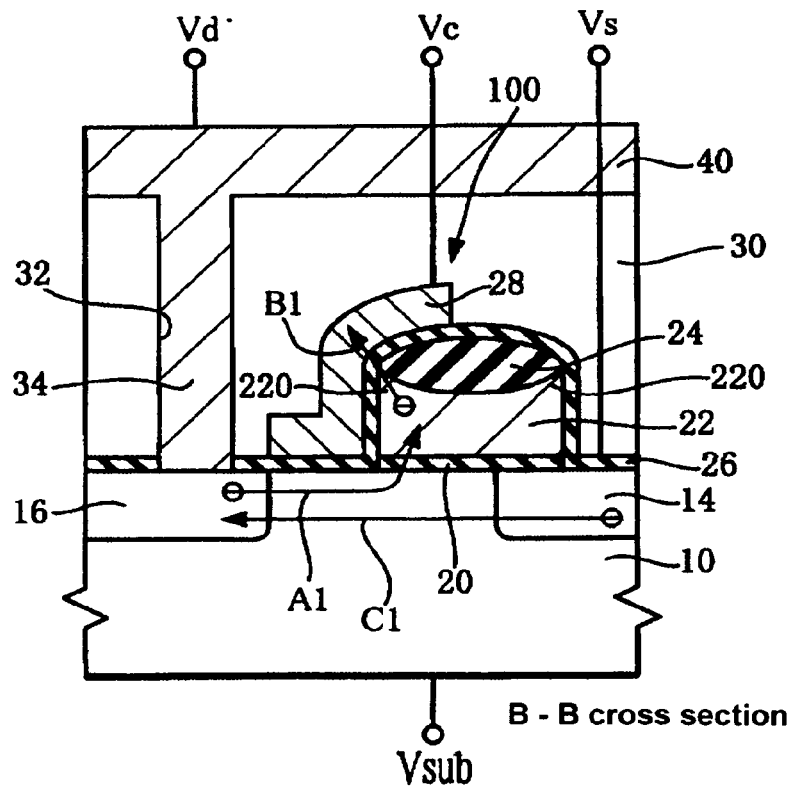

A semiconductor device in accordance with an embodiment is described. FIG. 1 schematically shows a plan view of a semiconductor device in accordance with one embodiment of the present invention. FIG. 2 schematically shows a plan view of a plan surface of a bulk. FIG. 3($a$) schematically shows a cross section taken along a line A—A of FIG. 1. FIG. 3($b$) schematically shows a cross section taken along a line B—B of FIG. 1.

The semiconductor device includes a non-volatile memory transistor having a split-gate structure (hereafter referred to as a "memory transistor") 100. The memory transistor is formed in an element-forming region that is defined by element isolation regions 12. The memory transistor 100 has a source region 14, a drain region 16 and a first dielectric layer 20 that functions as a gate insulation layer. The source region 14 and the drain region 16 are composed of $n^+$-type impurity diffusion layers formed in the silicon substrate 10 of P-type, in the case of an n-type transistor as an example. The first dielectric layer 20 is formed on a surface of the silicon substrate 10.

A floating gate 22 and a third dielectric layer 24 are successively formed on the first dielectric layer 20. The third dielectric layer 24 has a structure in which the thickness thereof becomes thinner from its center toward its end section. As a consequence, upper sections of peripheral sections 220 of the floating gate 22 form sharp edges. As a result, an electric field concentration is apt to occur at the upper sections of the peripheral sections 220 of the floating gate 22.

A second dielectric layer 26 is formed in a manner to cover an upper surface of the third dielectric layer 24, an upper surface of the floating gate 22 and a surface of the silicon substrate 10. The second dielectric layer 26 functions as a so-called tunneling dielectric layer.

A control gate 28 is formed on an upper surface of the second dielectric layer 26. A silicide layer may be formed on the control gate 28 depending on the requirements. For example, tungsten silicide, molybdenum silicide, titanium silicide, and cobalt silicide can be used as a material for the silicide layer.

An interlayer dielectric layer 30 is formed over the silicon substrate 10. A through hole 32 is formed in the interlayer dielectric layer 30. A contact layer 34 is formed in the through hole 32. The contact layer 34 is formed from, for example, a tungsten plug. A wiring layer (conduction layer) 40 is formed on the interlayer dielectric layer 30. The wiring layer 40 is electrically connected to the drain region 16 through the contact layer 34. The entirety of the floating gate 22 is overlapped by the wiring layer 40 as viewed in a plan view. More specifically, the floating gate 22 is completely covered by the wiring layer 40. More specifically, an end 40a of the wiring layer 40 is located outside of an end 22a of the floating gate 22, as viewed in a plan view. In other words, in FIG. 3(a), the wiring layer 40 is disposed opposing to and above the floating gate 22, and a width W30 of the wiring layer 40 is formed to be greater than a width W40 of the floating gate. This provides a structure in which the wiring layer 40 is disposed vertically above the entire surface of the floating gate 22. Alternatively, the end 40a of the wiring layer 40 may concur with the end 22a of the floating gate 22, as viewed in a plan view. When the side end section of the wiring layer 40 protrudes outwardly from the end 22a of the floating gate 22 as viewed in a plan view, the width W10 of the wiring layer 40 that outwardly protrudes from the end 22a of the floating gate 22, is preferably be 0.5 µm or smaller, and more preferably, 0.3 µm or smaller. The thickness of the wiring layer 40 is, for example, 0.3 to 1.0 µm, and more preferably, 0.3 to 0.8 µm.

Next, a method for operating the memory transistor 100 that comprises the semiconductor device in accordance with one example of the present embodiment will be described with reference to FIG. 3(b).

Referring to FIG. 3(b), Vc indicates a voltage applied to the control gate 28, Vs indicates a voltage applied to the source region 14, Vd indicates a voltage applied to the drain region 16, and Vsub indicates a voltage applied to the P-type silicon substrate 10.

For the operation of the memory transistor 100, a channel current is flown between the source region 14 and the drain region 16 to thereby inject a charge (hot electrons) in the floating gate 22 when data is written. When data is erased, a predetermined high voltage is applied to the control gate 28 to thereby transfer the charge stored in the floating gate 22 to the control gate 28 by FN conduction. Each of the operations in one example will be described below.

First, the data-writing operation will be described. It is noted that an arrow A1 indicates a flow of electrons at the time of writing.

For the data-writing operation, the source region 14 is set at a higher potential with respect to the drain region 16, and a specified potential is applied to the control gate 28 depending on the requirements. As a result, hot electrons that are generated near the drain region 16 are accelerated toward the floating gate 22, and injected in the floating gate 22 through the first dielectric layer 20 whereby data is written.

In the data-writing operation, for example, the control gate 28 is set at a potential (Vc) of 2 V, the source region 14 is set at a potential (Vs) of 10.5, and the drain region 16 is set at a potential (Vd) of 0.8 V. Also, the silicon substrate 10 is set at a potential (Vsub) of 0 V.

Next, the data-erasing operation will be described. It is noted that an arrow B1 indicates a flow of electrons at the time of erasing.

For the data-erasing operation, the control gate 28 is set at a potential higher than the potential of the source region 14 and the drain region 16. As a result, the charge stored in the floating gate 22 is discharged from the upper section 220 of the peripheral section of the floating gate 22, passing through the second dielectric layer 26, to the control gate 28 due to FN conduction, whereby the data is erased.

In the data-erasing operation, for example, the control gate 28 is set at a potential (Vc) of 11.5 V, the source region 14 and the drain region 16 are set at potentials (Vs) and (Vd) of 0 V, respectively. The silicon substrate 10 is set at a potential (Vsub) of 0 V.

Next, the data-reading operation will be described. It is noted that an arrow C1 indicates a flow of electrons at the time of reading.

For the data-reading operation, the drain region 16 is set at a higher potential than the source region 14, and a predetermined potential is applied to the control gate 23, whereby a determination is made whether or not data is written based on the presence or the absence of a formed channel. More specifically, when a charge is injected in the floating gate 22, the potential of the floating gate 22 becomes low, with the result that a channel is not formed and a drain current does not flow. Conversely, when the floating gate 22 is not injected with a charge, the floating gate 22 has a high potential, with the result that a channel is formed and a drain current flows. By detecting a current flowing from the drain region 16 by a sense amplifier, data in the memory transistor 100 can be read out.

In the data-reading operation, for example, the control gate 28 is set at a potential (Vc) of 3.0 V, the source region 14 is set at a potential (Vs) of 0 V, and the drain region 16 is set at a potential (Vd) of 1 V. The silicon substrate 10 is set at a potential (Vsub) of 0 V.

Effects which may be provided by a semiconductor device in accordance with the present embodiment are described below.

Figure 4:
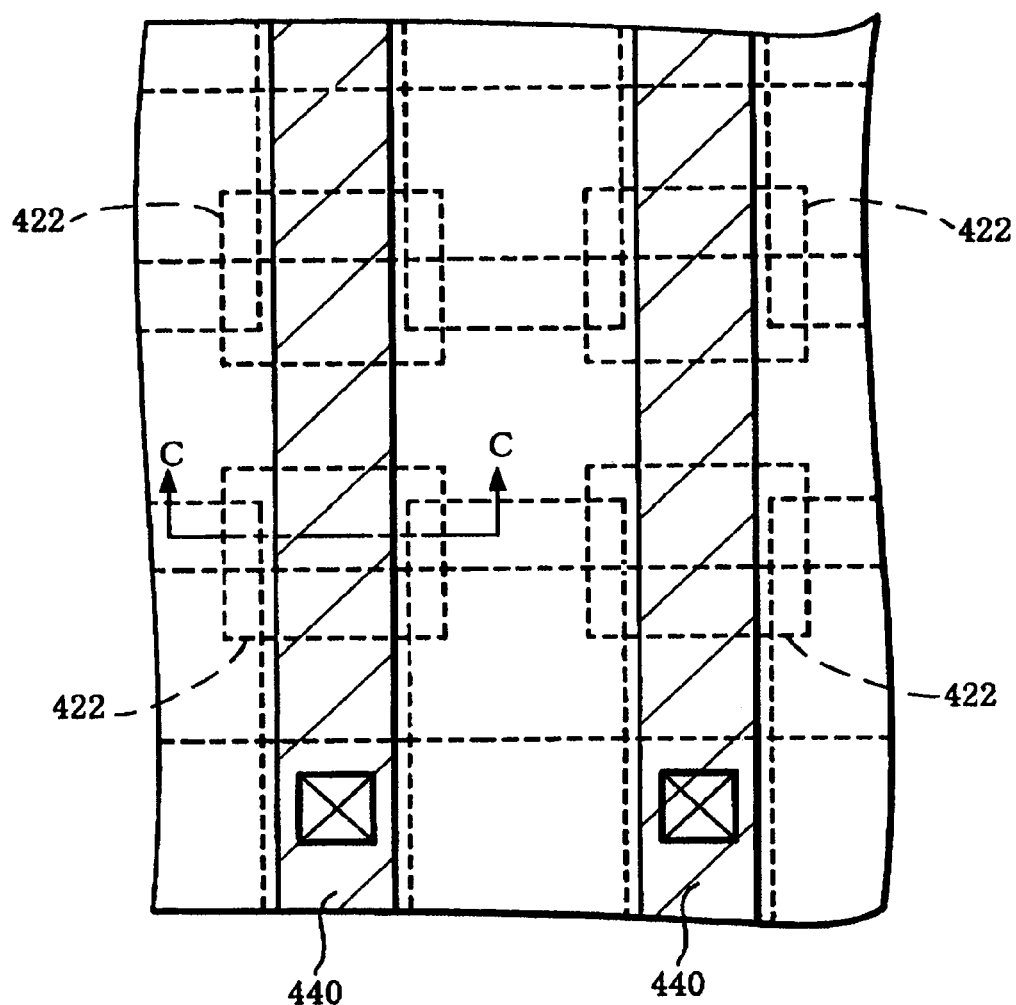
FIG. 4 schematically shows a plan view of a semiconductor device of a comparison example for describing the effects.
Figure 5:
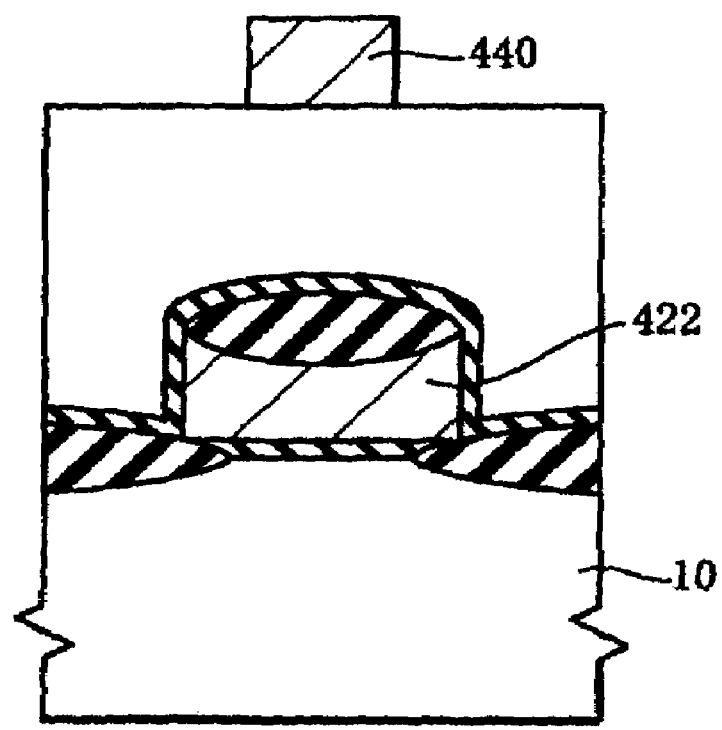
FIG. 5 schematically shows a cross-sectional view of a cross section taken along a line C—C of FIG. 4.

In the case where a wiring layer 440 is formed in a manner that a floating gate 422 is not entirely covered by the wiring layer 440 as viewed in a plan view, as shown in FIGS. 4 and 5. In this case, the following problems may occur when layers (for example, dielectric layers, metal layers) above the wiring layer 440 are formed. Charges (more specifically, process-induced charges) are generated in a variety of steps (for example, an etching step, a CVD (chemical vapor deposition) step and a sputtering step) for forming layers (dielectric layers, metal layers) above the wiring layer 440. When the entire floating gate 422 is not covered by the wiring layer 440 as viewed in a plan view, there is nothing to interrupt the charges, and the charges are trapped in a second dielectric layer (tunneling dielectric layer) 426 in a region where it contacts the floating gate 422. As a result, the second dielectric layer 426 deteriorates, and the rewriting capability number is lowered.

However, in accordance with the present embodiment, the entire floating gate 22 is overlapped by the wiring layer 40 as viewed in a plan view. The wiring layer 40 can interrupt charges generated in a variety of steps (for example, an etching step, a CVD (chemical vapor deposition) step and a sputtering step) for forming layers above the wiring layer 40. Accordingly, the wiring layer 40 can protect the floating gate from charges. As a consequence, the charges are prevented from being trapped in the second dielectric layer (tunneling dielectric layer) 26 in a region where it contacts the floating gate 22. As a result, deterioration of the second dielectric layer 26 can be suppressed, and the rewritable number can be improved.

The wiring layer 40 is electrically connected to the impurity diffusion layer that composes the drain region of the silicon substrate 10. Accordingly, charges (process-induced charges) are can be discharged through the wiring layer 40 to the silicon substrate 10. Therefore, the memory transistor 100 can be more securely protected from the charges.

The above-described embodiment has a structure in which the wiring layer 40 overlaps the entire floating gate 22 as viewed in a plan view, in other words, the wiring layer 40 is disposed vertically above the entire surface of the floating gate 22. However, without being limited to this structure, a conduction layer may be provided vertically above a region among the upper surface of the floating gate where the control gate is not disposed above. In this case, it provides a structure in which the control gate or the conduction layer is always disposed vertically above the entire surface of the floating gate, and the entire floating gate is overlapped by the control gate or the conduction layer as viewed in a plan view. Also, the control gate also has an effect to protect the floating gate from the process-induced charges. As a result, the entire floating gate can be protected from process-induced charges.

The semiconductor device in accordance with the present embodiment may be modified in a variety of ways, including the following.

(1) In the embodiment described above, the entire floating gate 22 is overlapped by the conduction layer as viewed in a plan view. However, without being limited to this structure, a conduction layer may be formed above a region of the floating gate where a control gate is not formed above. When a conduction layer is formed in this manner, the entire floating gate 22 is overlapped by the control gate and its conduction layer as viewed in a plan view.

Figure 12:
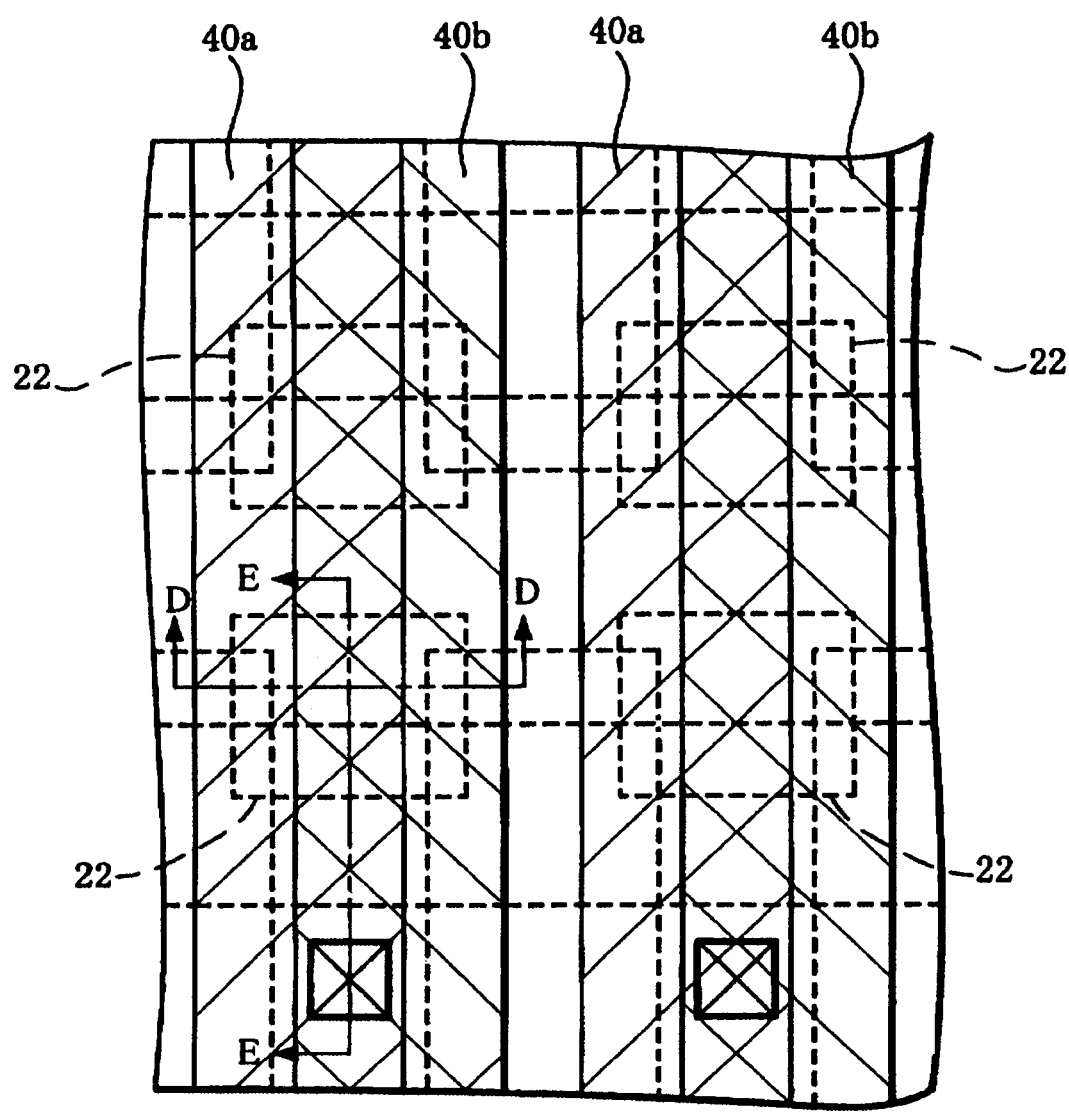
FIG. 12 shows a cross-sectional view of a step for manufacturing the semiconductor device in accordance with an embodiment of the present invention.
Figure 13:
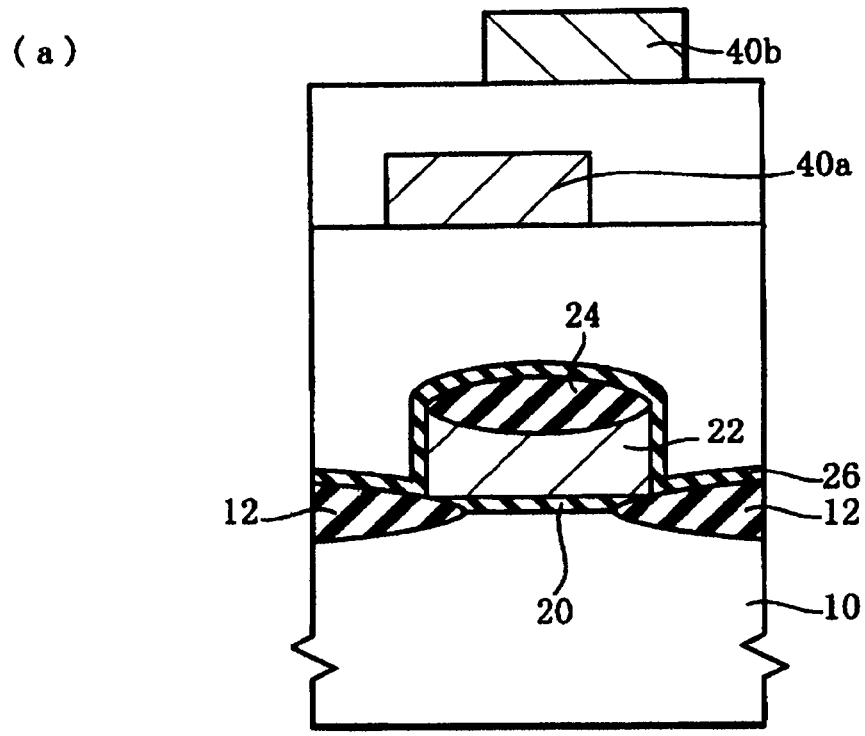
FIG. 13($a$) schematically shows a cross-sectional view of a cross section taken along a line D—D of FIG. 12, and ($b$) schematically shows a cross-sectional view of a cross section taken along a line E—E of FIG. 12.
Figure 13:
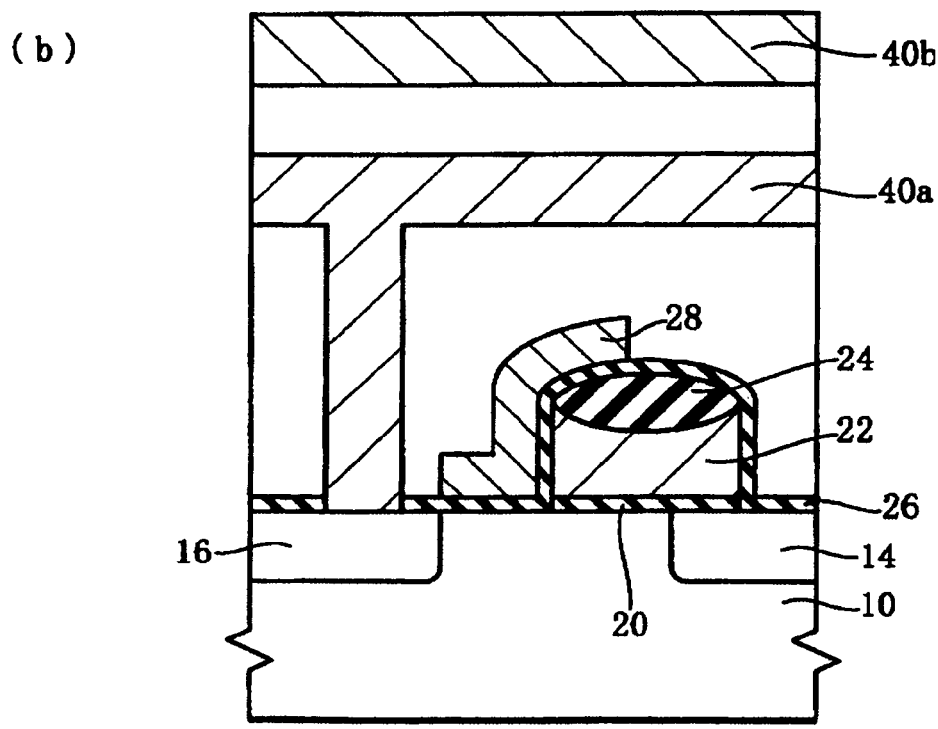

(2) As shown in FIG. 12 and FIG. 13, the entire floating gate 22 may be covered by a first conduction layer 40a and a second conduction layer 40b provided at different levels. More specifically, the first conduction layer 40a and the second conduction layer 40b may overlap the entirety of the floating gate 22. In this case, charges that are generated in a variety of steps (for example, an etching step, a CVD step and a sputtering step) for forming layers above the conduction layer 40b can be prevented from being trapped in the second dielectric layer in a region where it contacts the floating gate.

In another embodiment, the entirety of the floating gate may be overlapped by three or more conduction layers provided at different levels as viewed in a plan view.

Also, this modified example has a structure in which the entirety of the floating gate 22 is overlapped by a plurality of wiring layers provided at different levels as viewed in a plan view, in other words, the plurality of wiring layers are disposed vertically above the entire upper surface region of the floating gate 22. However, without being limited to this structure, at least one conduction layer among the plurality of conduction layers may be provided vertically above at least a region of the floating gate where the control gate is not disposed above.

Figure 15:
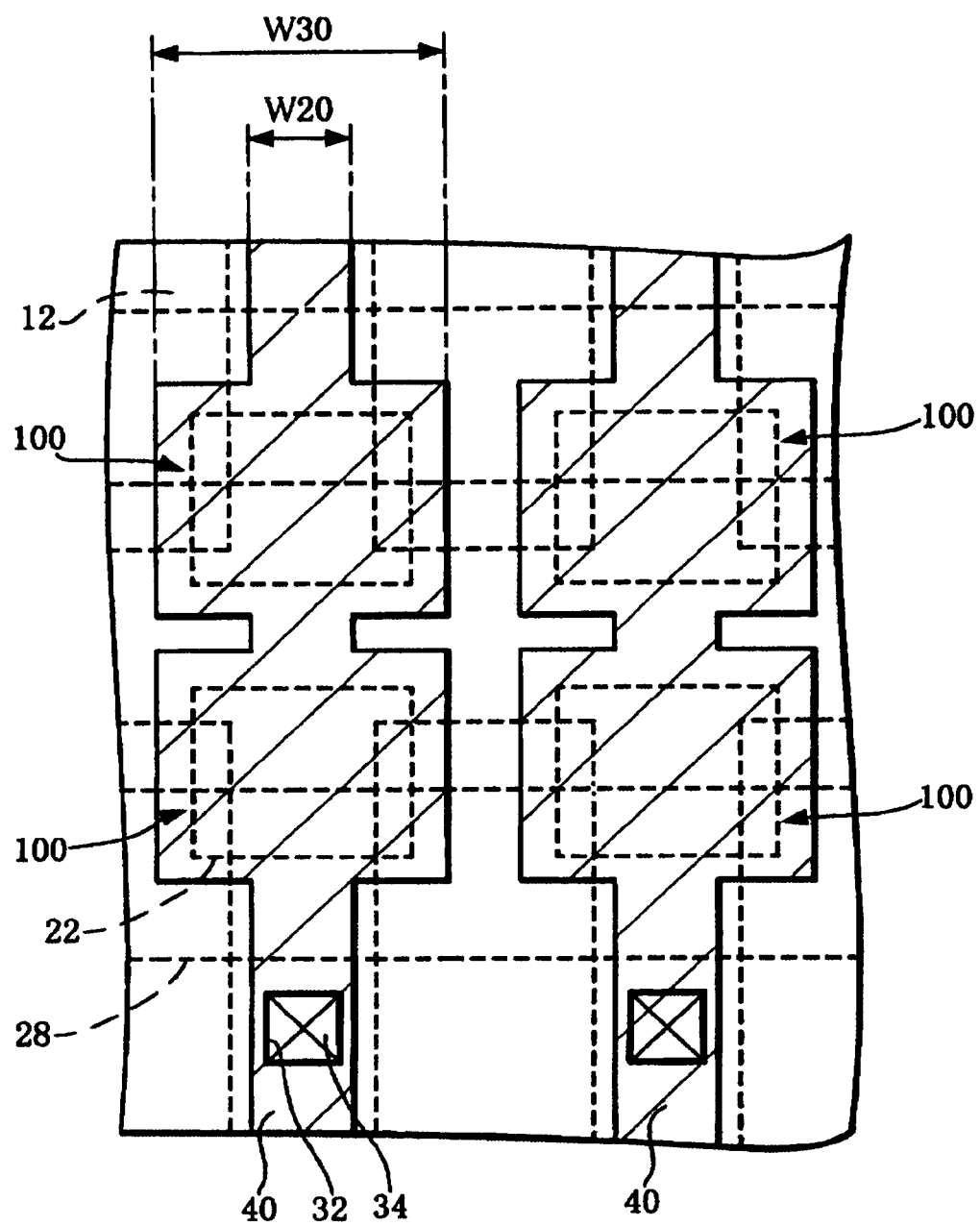
FIG. 15 schematically shows a plan view of a modified example of a semiconductor device in accordance with an embodiment of the present invention.
Figure 16:
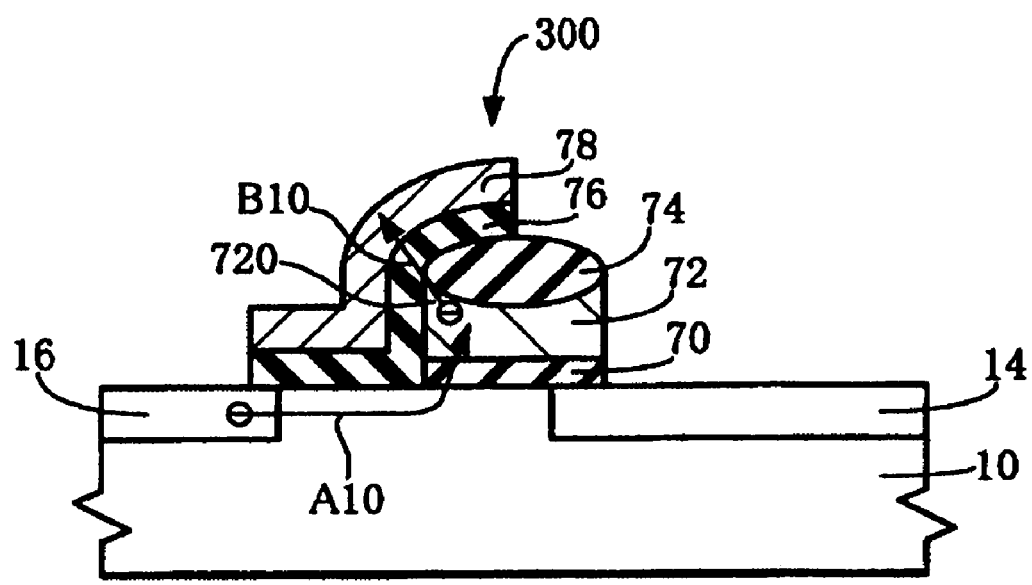
FIG. 16 schematically shows a cross-sectional view of a conventional example of a semiconductor device.

(3) As shown in FIG. 15, in another embodiment, the width W20 of the wiring layer 40 above a region other than a region where the floating gate 22 is formed may be narrower than the width W30 of the wiring layer 40 above the floating gate 22.

(4) In the embodiment described above, the floating gate 22 is covered by a wiring layer that is formed on the first layer of the interlayer dielectric layers. However, the floating gate 22 may be covered by a wiring layer that is formed on the second or upper layer of the interlayer dielectric layers.

(5) The wiring layer 40 may be connected to a diffusion layer (e.g., a diffusion layer in a Zener diode) having a positively low breakdown voltage.

A method for manufacturing the semiconductor device in accordance with one embodiment of the present invention will be described. FIGS. 6 through 11 schematically show cross sections of a semiconductor device in manufacturing steps in accordance with the present embodiment. In each of FIGS. 6 through 9, (a) schematically shows a cross section taken along a line A—A of FIG. 1, and (b) schematically shows a cross section taken along a line B—B of FIG. 1.

Figure 6:
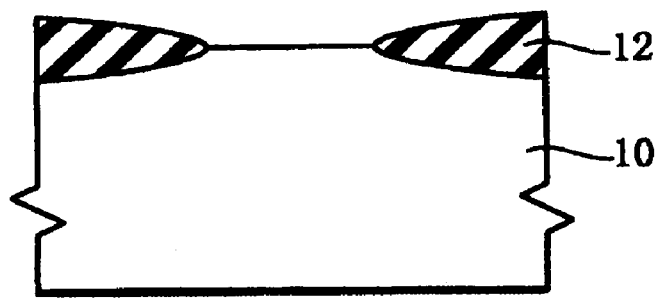
FIG. 6 shows a cross-sectional view of a step for manufacturing a semiconductor device in accordance with an embodiment of the present invention.
Figure 6:
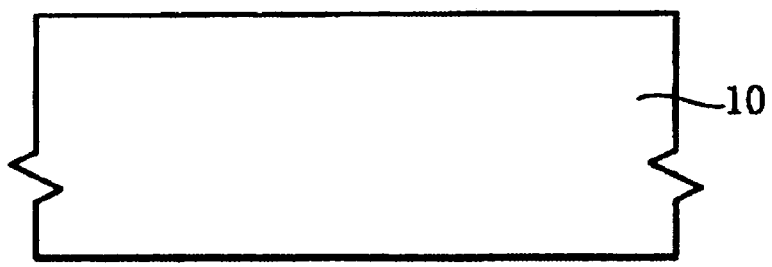

First, as shown in FIG. 6, an element isolation region 12 is formed in a specified region of a silicon substrate 10. The element isolation region 12 may be formed by, for example, a LOCOS method or a trench element isolation method.

Figure 7:
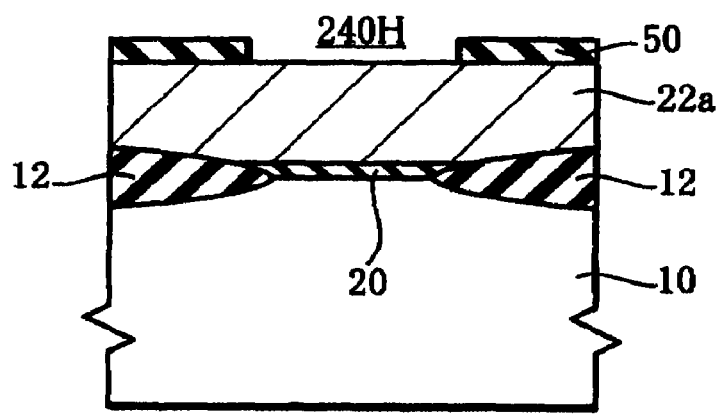
FIG. 7 shows a cross-sectional view of a step for manufacturing the semiconductor device in accordance with an embodiment of the present invention.
Figure 7:
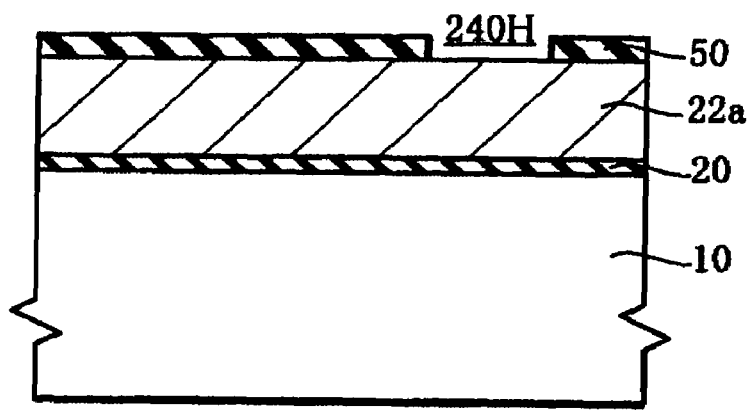

Next, as shown in FIG. 7, a silicon oxide layer (first dielectric layer) 20 is formed on a surface of the silicon substrate 10 by a thermal oxidation method. The silicon oxide layer 20 is not limited to a specific thickness, but may preferably have a thickness of 7 to 9 nm in view of the gate dielectric strength, the data retaining characteristic and the like.

Then, a polysilicon layer (conduction layer) 22a is formed on a surface of the silicon oxide layer 20, and phosphorous or arsenic may be diffused in the polysilicon layer 22a to form an n-type polysilicon layer 22a. The method for forming the polysilicon layer 22a is not particularly limited, and a CVD method may be used. The polysilicon layer 22a may preferably be formed to have a thickness of, for example, 50 to 300 nm, and more preferably, 100 to 200 nm.

The polysilicon layer 22a may be changed to n-type by other methods. For example, after the polysilicon layer 22a is formed, phosphorous ions or arsenic ions are implanted therein. Alternatively, after the polysilicon layer 22a is formed, it is contacted with a carrier gas containing phosphoryl chloride ($POCl_3$). Alternatively, when the polysilicon layer 22a is formed, it is contacted with a carrier gas containing phosphine ($PH_3$).

Then, a silicon nitride layer 50 is formed on a surface of the polysilicon layer 22a by, for example, a CVD method. Next, using a lithography technique, specified regions of the silicon nitride layer 50 are selectively etched and removed. A region 240H of the silicon nitride layer 50 that is removed is a region where a third dielectric layer 24 of the memory transistor 100 is formed.

Figure 8:
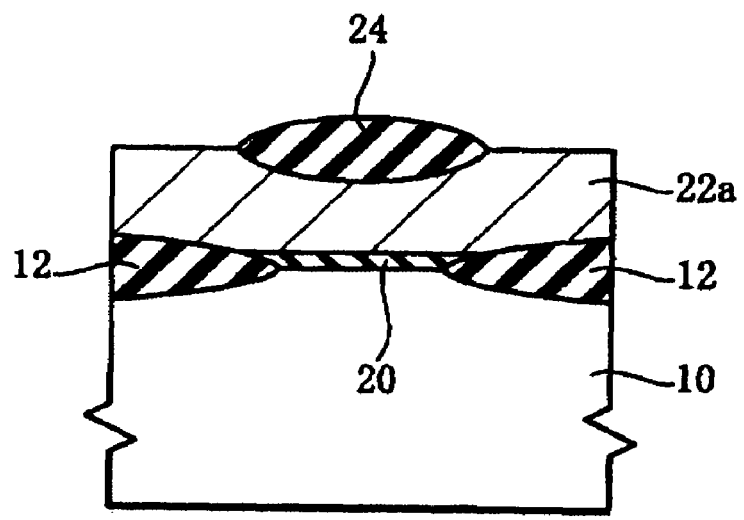
FIG. 8 shows a cross-sectional view of a step for manufacturing the semiconductor device in accordance with an embodiment of the present invention.
Figure 8:
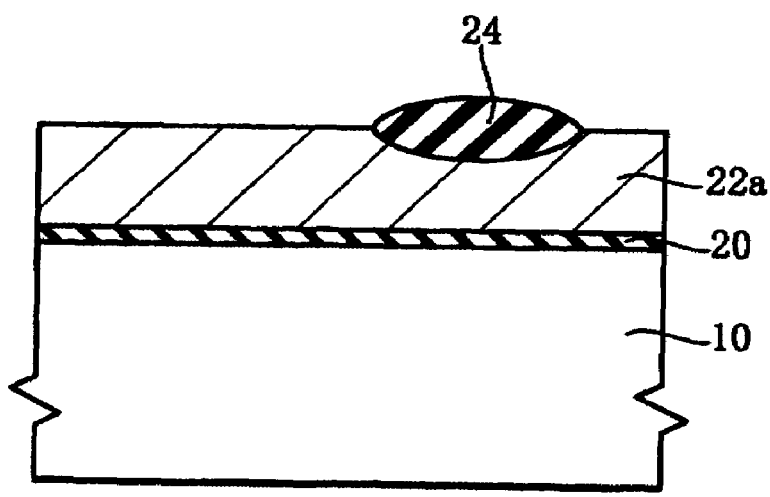

Next, as shown in FIG. 8, an exposed portion of the polysilicon layer 22a is selectively oxidized to form a third dielectric layer 24 on a surface of the polysilicon layer 22a in a specified region thereof. The third dielectric layer 24 formed by the selective oxidation has a structure in which it has a maximum film thickness at its central area, and gradually becomes thinner toward end sections thereof. Thereafter, the silicon nitride layer 50 is removed.

Figure 9:
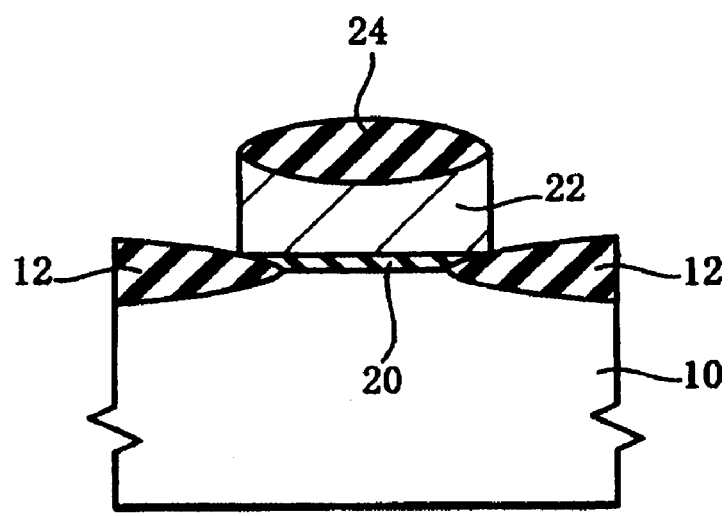
FIG. 9 shows a cross-sectional view of a step for manufacturing the semiconductor device in accordance with an embodiment of the present invention.
Figure 9:
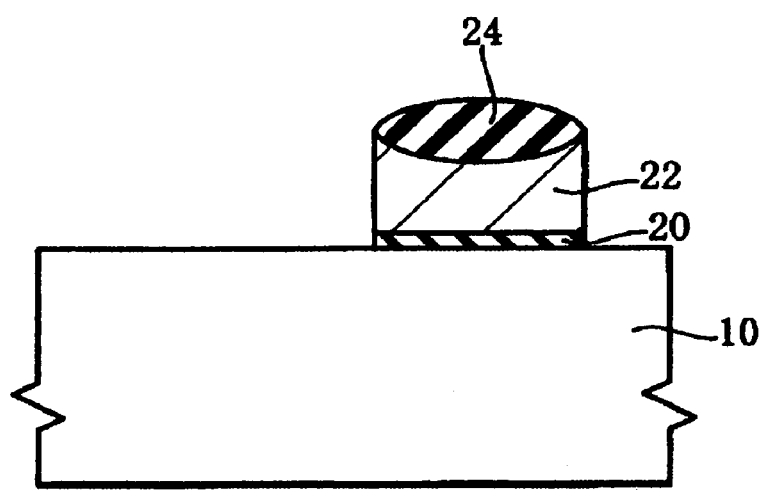

Then, as shown in FIG. 9, an etching is conducted using the third dielectric layer 24 as a mask to pattern the polysilicon layer 22a, to thereby form a floating gate 22. Further, the silicon oxide layer 20 on the silicon substrate 10 is removed.

Figure 10:
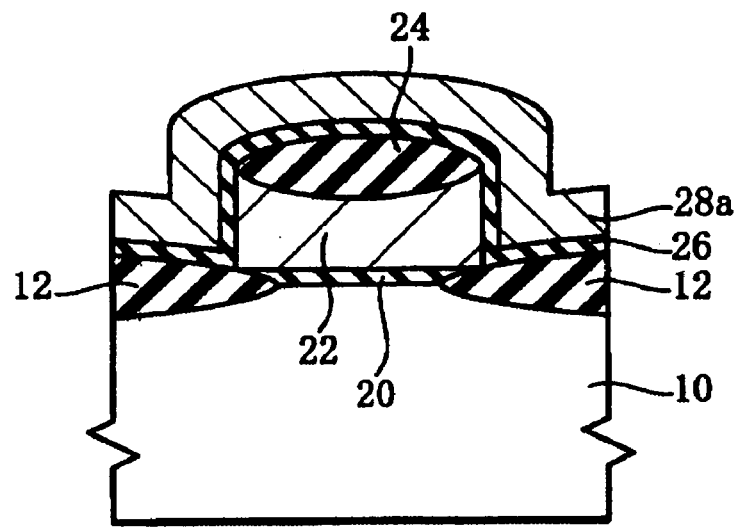
FIG. 10 shows a cross-sectional view of a step for manufacturing the semiconductor device in accordance with an embodiment of the present invention.
Figure 10:
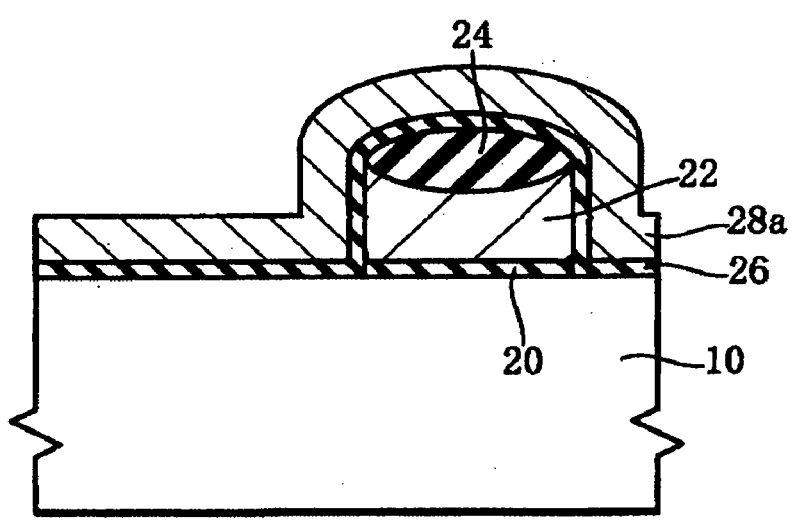

Next, as shown in FIG. 10, a silicon oxide layer (second dielectric layer) 26 is deposited on the silicon substrate 10. The thickness of the silicon oxide layer 26 is, for example, 20 to 25 nm measured from the upper surface of the silicon substrate 10 as a reference. The silicon oxide layer 26 may be formed by any method, for example, a thermal oxidation method, or a CVD method. A preferred CVD method is a high-temperature CVD method (for example, a silane-base high-temperature CVD method). Forming the silicon oxide layer 26 by a high-temperature CVD method provides an advantage in that the film quality of the silicon oxide layer 26 becomes dense.

Also, the silicon oxide layer 26 may be formed from a plurality of layers stacked in layers. More specifically, the silicon oxide layer 26 may have a stacked layered structure including, for example, a first silicon oxide layer obtained by a thermal oxidation method and a second silicon oxide layer obtained by a CVD method.

Next, a polysilicon layer 28a is formed on a surface of the silicon oxide layer 26. The polysilicon layer 28a may be formed by any method, for example, by a CVD method. The polysilicon layer 28a can be changed to n-type by the same method conducted for the polysilicon layer 22a described above. The film thickness of the polysilicon layer 28a is, for example, 50 to 300 nm.

Next, a silicide layer may be formed on the polysilicon layer 28a depending on the requirements. The silicide layer may be formed by, for example, a sputtering method or a CVD method.

Figure 11:
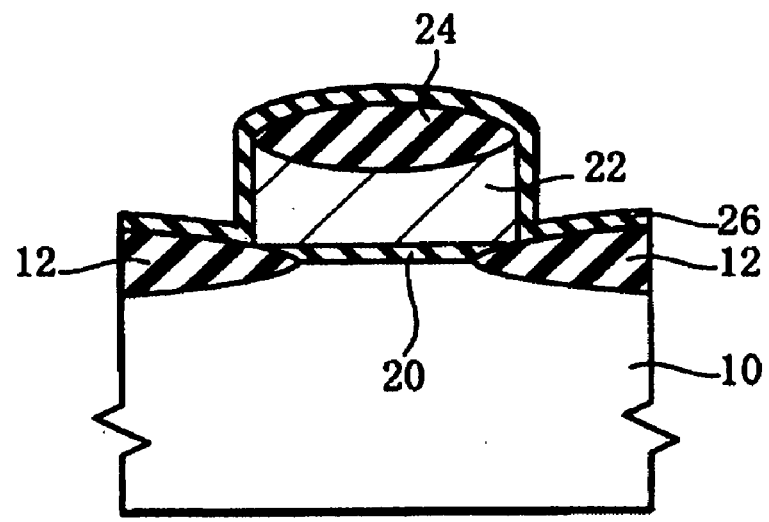
FIG. 11 shows a cross-sectional view of a step for manufacturing the semiconductor device in accordance with an embodiment of the present invention.
Figure 11:
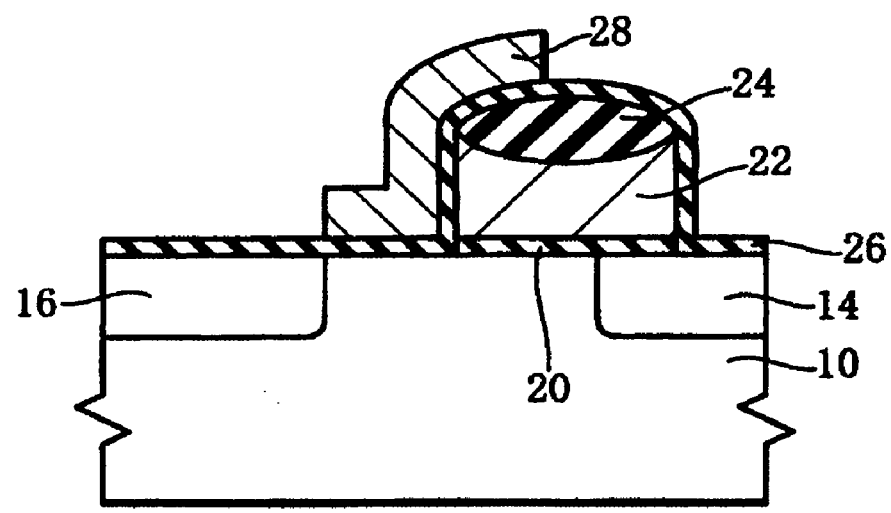

Next, a resist layer having a specified pattern is formed on the control gate 28. Then, the polysilicon layer 28a is patterned by an etching to form the control gate 28, as shown in FIG. 11.

Next, an n-type impurity is doped in the silicon substrate 10 by a known method to thereby form a source region 14 and a drain region 16. The steps described above form the memory transistor 100.

Next, as shown in FIG. 3, an interlayer dielectric layer 30 is formed on the entire surface. The interlayer dielectric layer 30 may be planarized by a chemical-mechanical polishing method depending on the requirements. Then, through holes 32 are formed in specified regions of the interlayer dielectric layer 30, and the through holes 32 are filled with a conduction material for form contact layers 34.

Then, a conduction layer is formed on the interlayer dielectric layer 30, and the conduction layer is patterned to form a wiring layer 40. Materials including, but not limited to, aluminum, copper, and an alloy of aluminum and copper may be used as a material of the wiring layer.

The semiconductor device may in certain embodiments include other circuit regions. The other circuit regions may include a logical circuit, an interface circuit, a gate array circuit, a memory circuit (for example, RAM and ROM), circuits such as a processor (for example, RISC) or a variety of IP (Intellectual Property) macros, or other digital circuits and analog circuits.

Figure 14:
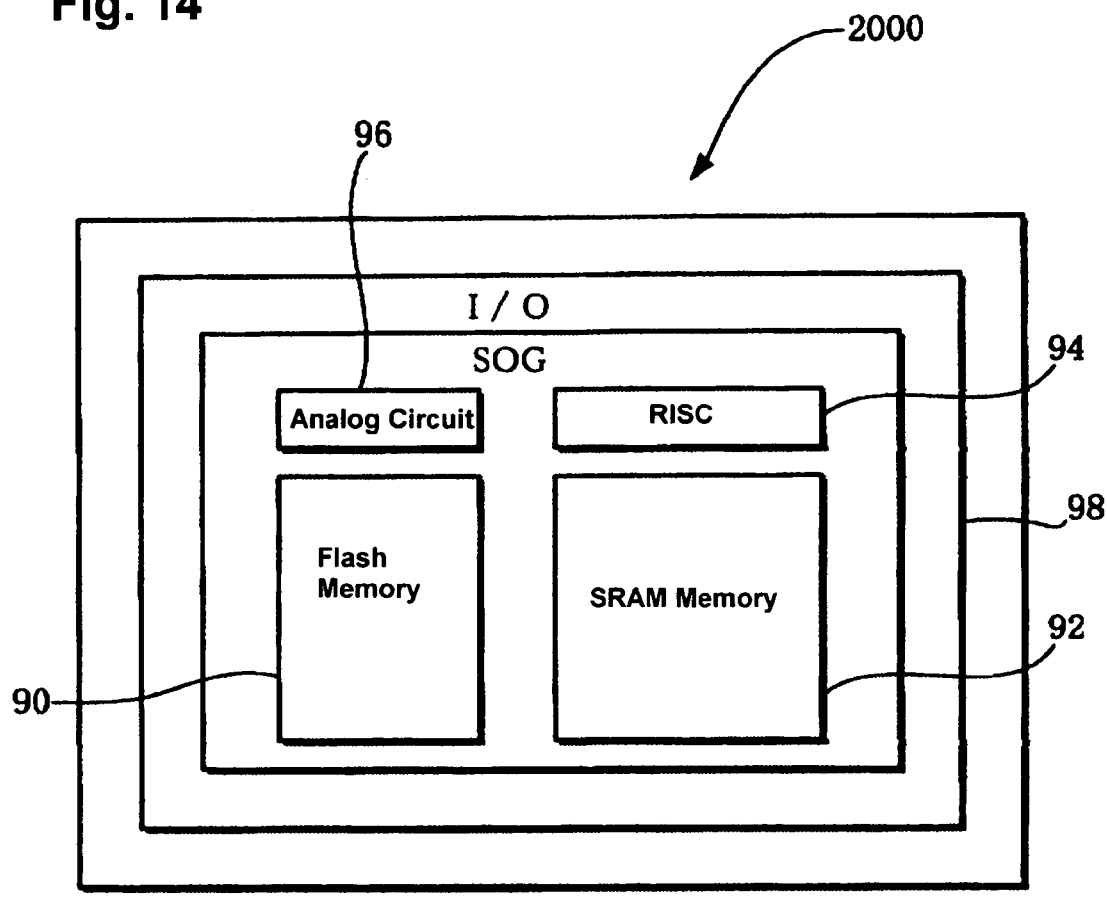
FIG. 14 schematically shows a layout of an embedded semiconductor device in accordance with an embodiment of the present invention.

More specifically, the following embedded semiconductor device is possible. FIG. 14 schematically shows a layout of an embedded semiconductor device in which a semiconductor device of the present invention is implemented. In this example, the embedded semiconductor device 2000 includes a flash-memory 90, an SRAM memory 92, a RISC 94, an analogue circuit 96 and an interface circuit 98 that are mixed and mounted in an SOG (sea of gates) structure. The memory transistor 100 may be a component of the flash memory 90.

The present invention is not limited to the embodiments described above, and many modifications can be made without departing the scope of the subject matter of the present invention.

What is claimed:

1. A semiconductor device having a non-volatile memory transistor, comprising:
   a semiconductor layer;
   a floating gate disposed over the semiconductor layer through a first dielectric layer as a gate dielectric layer;
   a second dielectric layer that contacts at least a part of the floating gate and is capable of functioning as a tunneling dielectric layer;
   a control gate formed over the second dielectric layer; and
   an impurity diffusion layer that forms a source region or a drain region formed in the semiconductor layer,
   wherein a plurality of conduction layers are formed at different levels above the floating gate, and the floating gate is entirely overlapped by the plurality of conduction layers as viewed in a plan view; and
   wherein at least one of the conduction layers outwardly protrudes from an end of the floating gate as viewed in a plan view, and a width of a portion of the conduction layer that outwardly protrudes from the end of the floating gate as viewed in a plan view is 0.5 µm or smaller.

2. A semiconductor device having a non-volatile memory transistor, comprising:
   a semiconductor layer;
   a floating gate disposed over the semiconductor layer through a first dielectric layer as a gate dielectric layer;
   a second dielectric layer that contacts at least a part of the floating gate and is capable of functioning as a tunneling dielectric layer;
   a control gate formed over the second dielectric layer; and
   an impurity diffusion layer that forms a source region or a drain region formed in the semiconductor layer,
   wherein a plurality of conduction layers are formed at different levels above the floating gate, and the floating gate is entirely overlapped by the plurality of conduction layers as viewed in a plan view; and
   wherein a side end of at least one of the conduction layers and an end of the floating gate are aligned with each other.

3. A semiconductor device having a non-volatile memory transistor, comprising:
   a semiconductor layer;
   a floating gate disposed over the semiconductor layer through a first dielectric layer comprising a gate dielectric layer;
   a second dielectric layer that contacts at least a part of the floating gate and is capable of functioning as a tunneling dielectric layer;
   a control gate formed over the second dielectric layer; and
   a plurality of conduction layers formed over the floating gate, the floating gate including an upper surface, wherein a line normal to any portion of the upper surface will contact at least one of the one or more conduction layers over the floating gate;
   wherein the control gate is formed over a first portion of the floating gate and a second portion of the floating gate is not covered by the control gate.

* * * * *